US009019783B2

(12) United States Patent
Yoon et al.

(10) Patent No.: US 9,019,783 B2
(45) Date of Patent: Apr. 28, 2015

(54) SEMICONDUCTOR MEMORY DEVICE INCLUDING WRITE DRIVER AND METHOD OF CONTROLLING THE SAME

(71) Applicant: SK Hynix Inc., Icheon-si Gyeonggi-do (KR)

(72) Inventors: Jung Hyuk Yoon, Icheon-si (KR); Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 232 days.

(21) Appl. No.: 13/720,941

(22) Filed: Dec. 19, 2012

(65) Prior Publication Data

US 2014/0063989 A1 Mar. 6, 2014

(30) Foreign Application Priority Data

Aug. 29, 2012 (KR) ........................ 10-2012-0095213

(51) Int. Cl.
*G11C 7/12* (2006.01)
*G11C 7/10* (2006.01)

(52) U.S. Cl.
CPC ................ *G11C 7/12* (2013.01); *G11C 7/1096* (2013.01); *G11C 2207/005* (2013.01)

(58) Field of Classification Search
CPC .... G11C 13/0004; G11C 7/12; G11C 7/1096; G11C 2207/005
USPC .................. 365/230, 163, 189, 148, 207, 203
See application file for complete search history.

(56) References Cited

U.S. PATENT DOCUMENTS

| | | | | |
|---|---|---|---|---|
| 7,342,840 | B2 * | 3/2008 | Tran | 365/207 |
| 7,855,923 | B2 | 12/2010 | Li et al. | |
| 8,406,043 | B2 * | 3/2013 | Yoon | 365/163 |
| 8,760,942 | B2 * | 6/2014 | Oh et al. | 365/148 |
| 2007/0070753 | A1 * | 3/2007 | Tran | 365/207 |
| 2007/0183234 | A1 * | 8/2007 | Han et al. | 365/203 |
| 2010/0054016 | A1 * | 3/2010 | Kajigaya | 365/148 |
| 2011/0149643 | A1 * | 6/2011 | Yoon | 365/163 |
| 2012/0195113 | A1 * | 8/2012 | Yoon et al. | 365/163 |
| 2013/0208530 | A1 * | 8/2013 | Oh et al. | 365/148 |

* cited by examiner

*Primary Examiner* — Richard Elms
*Assistant Examiner* — Jerome Leboeuf
(74) *Attorney, Agent, or Firm* — William Park & Associates Ltd.

(57) ABSTRACT

Disclosed is a method of controlling a semiconductor memory device including a write driver. A method of controlling a phase change memory device includes turning on switches connected to a global bit line and a local bit line, respectively, enabling a write driver connected to the switches, enabling a word line, and enabling a memory cell to be accessed by the word line, wherein control is performed so that electric charges supplied from the write driver through the switches are charged when the write driver is enabled.

11 Claims, 3 Drawing Sheets

100
VPP1
WDB
110
GYSW
120
GBL
C1
DIS
160
R1
b
VSS
LYSW
130
a
BL
VPP2
150
R2
C2
WLCNT
PM
140
R
WL
NM
VSS

SEMICONDUCTOR MEMORY DEVICE INCLUDING WRITE DRIVER AND METHOD OF CONTROLLING THE SAME

CROSS-REFERENCES TO RELATED APPLICATION

The present application claims priority under 35 U.S.C. §119(a) to Korean application number 10-2012-0095213, filed on Aug. 29, 2012, in the Korean Intellectual Property Office, which is incorporated herein by reference in its entirety.

BACKGROUND

1. Technical Field

The present invention generally relates to a semiconductor memory device and a method of controlling the same, and more particularly, to a semiconductor memory device including a write driver and a method of controlling the same.

2. Related Art

According to a need for an increase in the capacity and speed of semiconductor memory devices and a reduction in the power of semiconductor memory devices, researches are being carried out on the next-generation memory devices which can embody the high degree of integration and low consumption power of DRAM devices, the nonvolatile property of flash memory, and the high-speed operation of SRAM. The next-generation memory devices that are now being in the highlight include phase change random access memory (PRAM) using a phase change material, resistance random access memory (RRAM) using material having a variable resistance characteristic, such as transition metal oxides, and magnetic random access memory (MRAM) using ferromagnetic material. Common points in the materials of the next-generation memory devices are that the resistance values of the materials are varied depending on the size and/or direction of a current or voltage, the materials have a nonvolatile characteristic in which the resistance values of the materials remain intact even when a current or voltage is cut off, and the materials do not need to be refreshed.

A unit memory cell of this resistive memory device can include one resistance element and one switch element. Data is stored by changing the resistance of each resistance element by controlling the current or voltage of a word line and bit line connected to memory cells.

The write driver of this phase change memory device is described below. A current is supplied using a high voltage and the gate bias voltage of a PMOS.

When a word line is enabled in response thereto, a current supplied from the write driver is transferred to a memory cell. Line resistance, the resistance component of a switch element, etc. are inevitably generated in a current path.

Accordingly, the write driver may need to supply a larger amount of current according to circumstances. In contrast, when a common amount of current is supplied to a memory cell, data to be written may not be properly written.

SUMMARY

In an embodiment, a method of controlling a semiconductor memory device includes turning on switches connected to a global bit line and a local bit line, respectively, enabling a write driver connected to the switches, enabling a word line, and enabling a memory cell to be accessed by the word line, wherein control is performed so that electric charges supplied from the write driver through the switches are charged when the write driver is enabled.

In an embodiment, a method of controlling a semiconductor memory device includes enabling a write driver in response to a write command, enabling a word line after enabling the write driver, and enabling a memory cell to be accessed by the word line, wherein when a write current is supplied to the memory cell, an overshoot is generated so that the write current having an instant peak value is supplied to the memory cell.

In an embodiment, a semiconductor memory device includes a write driver configured to supply a write current in response to a write command, first and second switches connected to the write driver and configured to supply the write current to a memory cell in response to a global bit line control signal and a local bit line control signal, and a word line controller configured to perform control so that the write current flowing through the memory cell sinks in response to a word line control signal, wherein the global bit line control signal and the local bit line control signal are enabled earlier than the word line control signal.

In accordance with this technology, a stable write current can be supplied by changing the control scheme of a circuit without a significant change of the circuit. Accordingly, area efficiency can be increased, and the reliability of a write operation can be improved.

BRIEF DESCRIPTION OF THE DRAWINGS

Features, aspects, and embodiments are described in conjunction with the attached drawings, in which.

DETAILED DESCRIPTION

Hereinafter, a semiconductor memory device and a method of controlling the same according to various embodiments will be described below with reference to the accompanying drawings through the embodiments.

A phase change memory device from among various semiconductor memory devices is illustrated, but the present invention is not limited thereto. The phase change memory device is described as an example in order to embody an object of the present invention.

Figure 1:
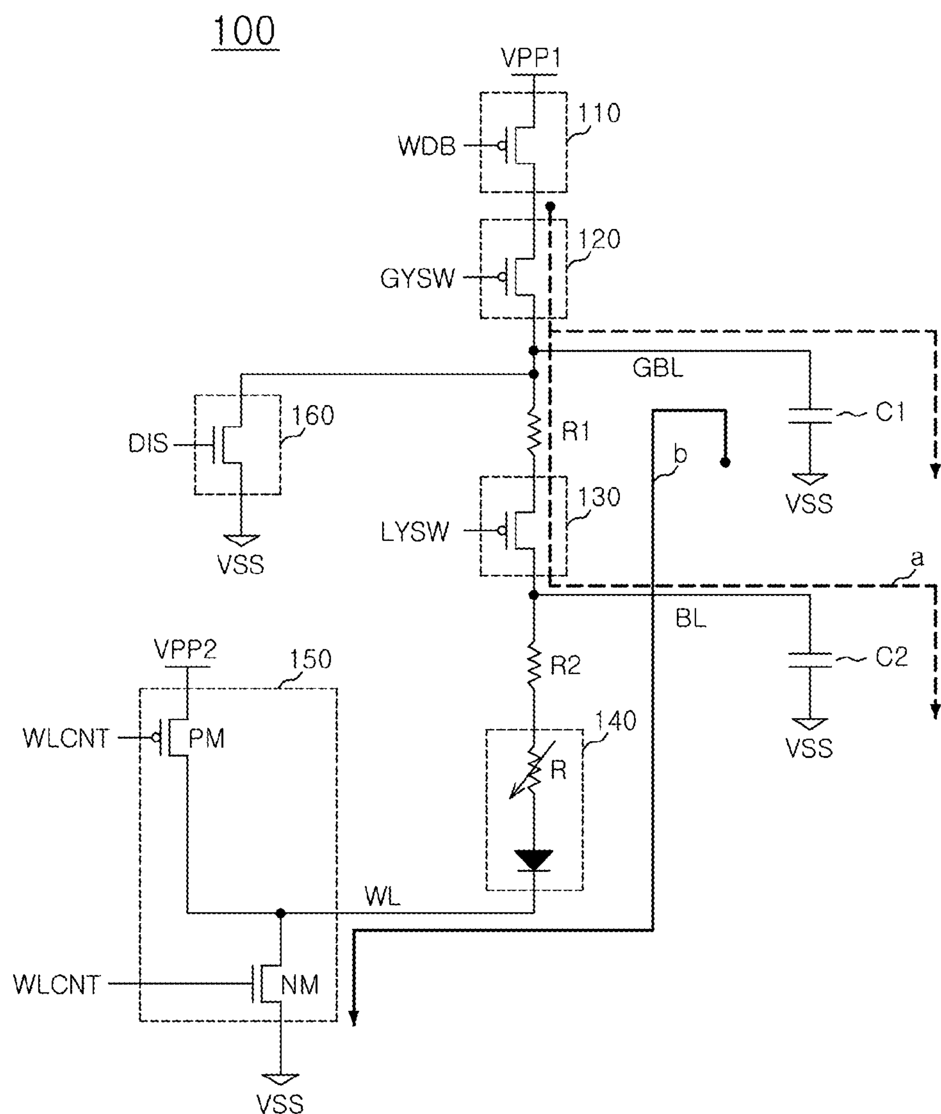
FIG. 1 shows the construction of a phase change memory device including a write driver in accordance with an embodiment.

FIG. 1 shows the construction of a phase change memory device including a write driver in accordance with an embodiment.

Referring to FIG. 1, the phase change memory device may include a write driver 110, a first switch 120, a second switch 130, a memory cell 140, a word line controller 150, and a discharge unit 160.

The write driver 110 may be enabled in response to a write driver enable signal WDB (i.e., write command) and configured to include a PMOS. When the write driver 110 is enabled, a first high voltage VPP1 may be supplied to a next circuit unit through the PMOS.

The first switch 120 is a switch element connected to a global bit line GBL and configured to include a PMOS that responds to a first switch element enable signal GYSW (i.e., global bit line control signal). A first capacitor C1 may be connected to the global bit line GBL. The first switch 120 conducts electric charges, supplied from the write driver 110, when the first switch element enable signal GYSW is enabled. The first capacitor C1 connected to the first switch 120 charges the conducting electric charges. At this time, the high voltage VPP1 supplied from the write driver 110 can drop by a specific voltage while passing through the first switch 120.

The second switch 130 is a switch element connected to a local bit line BL and configured to include a PMOS that responds to a second switch element enable signal LYSW (i.e., local bit line control signal). A second capacitor C2 may be connected to the local bit line BL. The second switch 130 conducts electric charges, supplied from the write driver 110, when the second switch element enable signal LYSW is enabled. A second capacitor C2 connected to the second switch 130 charges the conducting electric charges. At this time, the high voltage VPP1 supplied from the write driver 110 can drop by a specific voltage while passing through the second switch 130.

Additionally, a first resistor R1 between the first switch 120 and the second switch 130 and a second resistor R2 between the second switch 130 and the memory cell 140 can be considered as parasitic resistors.

The memory cell 140 can include a variable resistor R made of a phase change material whose crystalline state is changed by a current and a switch element D (not shown) configured to control a current supplied to the variable resistor R. As a representative example, a calcogenide material can be used as the phase change material that forms the variable resistor R. Furthermore, a diode of a vertical structure having a small unit area can be used as the switch element D, but a variety of switch elements can be applied to the diode.

The word line controller 150 may be configured to select a word line to which a memory cell to be written, selected from a plurality of memory cells, may be connected. The word line controller 150 further may include a pre-decoder, a row decoder, and a row selector, although not shown, and enables a corresponding word line through the row selector by enabling any one of row addresses. The word line controller 150 may include a PMOS PM and an NMOS NM that respond to a word line enable signal WL CNT. When the word line enable signal WL CNT (i.e., word line control signal) is enabled, the word line controller 150 conducts the NMOS NM so that an electric current flowing through the memory cell 140 sinks. When the word line enable signal WL CNT is disabled, the word line controller 150 conducts the PMOS PM so that voltage across the memory cell 140 maintains a second high voltage VPP2.

The discharge unit 160 may include an NMOS that responds to a discharge enable signal DIS. When the discharge enable signal DIS is enabled, the discharge unit 160 discharges the voltage of the global bit line GBL. A write pulse can be formed by this operation of the discharge unit 160.

The operation of the phase change memory device in accordance with an embodiment is described in detail below.

When data is sought to be written, first, the first and the second switches 120 and 130 are enabled in response to a write command (not shown).

That is, the first switch element enable signal GYSW and the second switch element enable signal LYSW are enabled, thereby turning on the first and the second switches 120 and 130.

At this time, the word line enable signal WL CNT in accordance with an embodiment are controlled so that it is in an inactive state.

Next, when the write driver 110 is enabled, the first high voltage VPP1 starts being charged in the first capacitor C1 and the second capacitor C2 through the first and the second switches 120 and 130. More particularly, electric charges by the first high voltage VPP1 from the write driver 110 are charged in the first capacitor C1 and the second capacitor C2.

At this time, voltage across the memory cell 140 can have substantially the same level as the first high voltage VPP1.

Next, when the word line enable signal WL CNT is enabled and a word line is enabled, the electric charges charged in the first capacitor C1 and the second capacitor C2 rapidly move to the memory cell 140 through the word line. Thus, the amount of current becomes a level or higher that can be supplied by the write driver 110, leading to an instant overshoot. Accordingly, data can be certainly programmed into the memory cell 140 by a write current having an instant peak value.

A write pulse shape is formed by enabling the discharge unit 160.

Normally, when data is sought to be written, the memory cell 140 is enabled by enabling a word line. Next, the first and the second switches 120 and 130 are enabled so that a high voltage can drop to a desired level from the write driver 110. As a result, an electric current from the write driver 110 can be supplied to the memory cell 140.

In this process or the present embodiments, however, line resistance occurring in a current path, the resistance of a global bit line, a local bit line, and a word line, and resistance in the first and the second switches are formed, with the result that path resistance is inevitably generated in the current path. Accordingly, the amount of current to be supplied to the memory cell 140 is lost.

For this reason, if data is sought to be written into the memory cell 140, a larger amount of current must be supplied. If a large amount of current conducts as described above, voltage at the drain of the PMOS of the write driver 110 can rise. Accordingly, the PMOS operates in a linear area because a voltage Vds (not shown) between the drain and source of the PMOS of the write driver 110 is reduced. Accordingly, desired data can be written into the memory cell 140 because there is a limit to the supply of a desired high current although voltage at the gate of the PMOS of the write driver 110 is lowered. In contrast, if the level of the high voltage VPP1 of the write driver 110 is raised using a pump, an area of the pump is increased.

In accordance with an embodiment, however, an effective write operation can be embodied by changing the control scheme of a circuit even without adding an additional pump and without changing the circuit.

That is, in accordance with an embodiment, some amount of voltage from the write driver 110 is charged (a) by turning on the first and the second switches 120 and 130 before the word line WL is enabled and then the word line is then enabled, so that an instant overshoot is generated (b) and a cell current rises. FIG. 1 also shows a ground voltage VSS.

Figure 2:
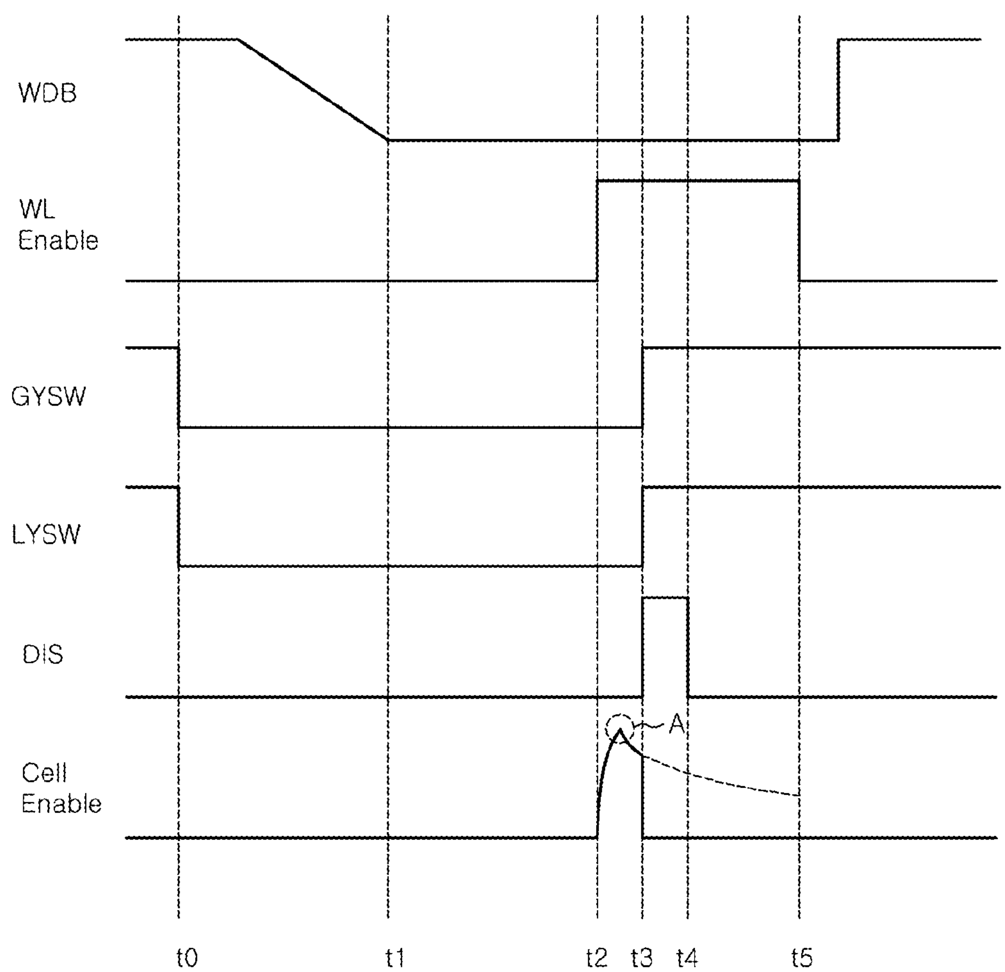
FIG. 2 shows a timing diagram of the phase change memory device shown in FIG. 1.

FIG. 2 shows a timing diagram of the phase change memory device shown in FIG. 1. An operation in accordance with an embodiment is described below with reference to FIGS. 1 and 2.

At a time t0, the first and the second switches 120 (i.e., GYSW) and 130 (i.e., LYSW) are turned on.

At this time, the word line WL (i.e., WL Enable) and the write driver 110 (i.e. WDB) are in an inactive state.

At a time t1, the write driver 140 is enabled.

In response thereto, electric charges from the write driver 140 start being charged in the first and the second capacitors C1 and C2 connected to the first and the second switches 120 and 130.

At a time t2, when the word line WL is enabled (i.e., WL Enable), an electric current is supplied to the memory cell 140 (i.e. Cell Enable). At this time, an instant overshoot A can be generated and thus a large amount of current can be supplied to the memory cell 140 (i.e., Cell Enable).

At a time t3, when the discharge unit 160 (i.e., DIS) is enabled, the cell current is suddenly reduced and thus a write pulse is formed.

At a time t4, the first and the second switches 120 and 130 are still enabled but GBL and BL are disabled by DIS.

At a time t5, the word line WL is disabled (i.e., WL Enable).

As described above, during the section of the times t1~t2, the electric charges supplied from the write driver 140 can be fully charged in the first and the second capacitors C1 and C2, and the electric charges rarely leak to other places because the word line WL has not yet been enabled. Accordingly, when the word line WL is enabled at the time t2, the instant overshoot A is generated, so that a higher write current can be supplied.

Additionally, if the discharge unit 160 is not enabled, the write pulse will have a pulse shape that slowly drops to the time t5.

Figure 3:
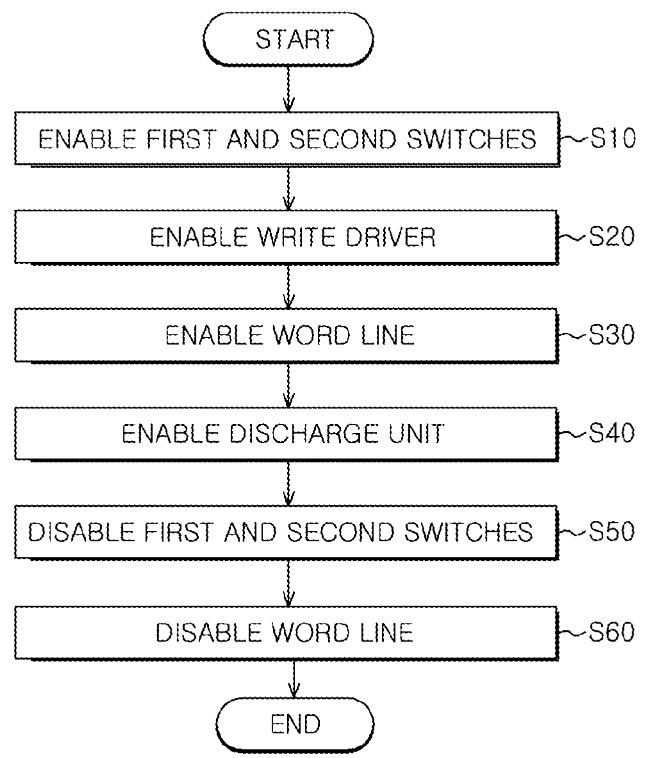
FIG. 3 is a flowchart illustrating a method of controlling the phase change memory device of FIG. 1.

FIG. 3 is a flowchart according to the operation of FIGS. 1 and 2.

Referring to FIGS. 1 to 3, when a write operation is started in response to a write command, the first and the second switches 120 and 130 are enabled at step S10 (i.e., ENABLE FIRST AND SECOND SWITCHES).

Next, the write driver 110 is enabled at step S20 (i.e., ENABLE WRITE DRIVER).

In response thereto, electric charges through the write driver 110 are supplied to the first and the second capacitors C1 and C2 connected to the first and the second switches 120 and 130.

Next, the word line WL is enabled at step S30 (i.e., ENABLE WORD LINE).

A conduction path along which the electric charges charged in the first and the second capacitors C1 and C2 are suddenly discharged at once is formed, thereby generating an instant overshoot. As a result, an electric current is supplied to the memory cell 140.

When the discharge unit 160 is enabled, a write pulse is formed at step S40 (i.e., ENABLE DISCHARGE UNIT).

After the supply of the write current is completed, the first and the second switches 120 and 130 are disabled at step S50 (i.e., DISABLE FIRST AND SECOND SWITCHES).

Next, the word line WL is disabled at step S60 (i.e., DISABLE WORD LINE).

As described above, in accordance with an embodiment, the word line WL is enabled at a point of time different from a point of time at which the first and the second switches 120 and 130 are enabled, that is, the first and the second switches 120 and 130 are enabled earlier than the word line WL, so that an instant overshoot is generated when the word line WL is enabled. Accordingly, a problem in which an electric current is reduced by the loss of electric charges due to a resistance component generated in a current path from a current source to a memory cell can be compensated for. As a result, a more stable write operation can be supported.

While various embodiments have been described above, it will be understood to those skilled in the art that the embodiments described are by way of example only. Accordingly, the device and method described herein should not be limited based on the described embodiments.

What is claimed is:

1. A method of controlling a semiconductor memory device, comprising:

turning on switches connected to a global bit line and a local bit line, respectively;

enabling a write driver connected to the switches;

enabling a word line; and enabling a memory cell to be accessed by the word line, wherein in the turning on of switches, control is performed so that electric charges supplied from the write driver are charged by capacitors connected to the respective switches, and when enabling the word line, control is performed so that an overshoot is generated by a sudden discharge of the electric charges charged in the capacitors.

2. The method according to claim 1, wherein control is performed so that the global bit line and the local bit line are enabled earlier than the word line by the switches.

3. A method of controlling a semiconductor memory device, comprising:

enabling a write driver in response to a write command;

enabling a word line after enabling the write driver; and enabling a memory cell to be accessed by the word line, wherein the enabling of a word line comprises turning on switches connected to a global bit line and a local bit line, respectively, and wherein in the turning on of switches, control is performed so that electric charges supplied from the write driver are charged by capacitors connected to the respective switches, and when enabling the word line, control is performed so that an overshoot is generated by a sudden discharge of the electric charges charged in the capacitors.

4. The method according to claim 3, wherein when enabling the write driver, control is performed so that the global bit line and the local bit line are enabled earlier than the word line by the switches.

5. The method according to claim 3, further comprising discharging a write current supplied to the memory cell after a specific time when the word line is enabled.

6. A semiconductor memory device, comprising:

a write driver configured to supply a write current in response to a write command;

first and second switches connected to the write driver and configured to supply the write current to a memory cell in response to a global bit line control signal and a local bit line control signal; and a word line controller configured to perform control so that the write current flowing through the memory cell sinks in response to a word line control signal, wherein first and second switches are controlled so that electric charges supplied from the write driver are charged by first and second capacitors connected to the first and second switches, respectively, and the word line controller is controlled so that an overshoot is generated by a sudden discharge of the electric charges charged in the first and second capacitors.

7. The semiconductor memory device according to claim 6, wherein:

the first capacitor is connected to the first switch through a global bit line; and the second capacitor is connected to the second switch through a local bit line.

8. The semiconductor memory device according to claim 7, further comprising a discharge unit connected to the global bit line.

9. The semiconductor memory device according to claim 8, wherein the discharge unit is configured for discharging the voltage of the global bit line in response to a discharge enable signal.

10. The semiconductor memory device according to claim 6, wherein the memory cell is connected to the word line controller through a word line.

11. The semiconductor memory device according to claim 8, wherein the write driver, first switch, and second switch comprise of PMOS transistors, and the discharge unit comprises a NMOS transistor.

* * * * *